United States Patent [19]

Bailey, Jr. et al.

[11] 4,370,516

[45] Jan. 25, 1983

[54] COOPERATIVE TV-FM CABLE SPLITTER-GROUND MODULE AND HOUSING THEREFOR

[76] Inventors: Arvin K. Bailey, Jr., 113 Estes Dr. Extension; Richard S. Taylor, 115 Estes Dr. Extension, both of Carrboro, N.C. 27510

[21] Appl. No.: 262,035

[22] Filed: May 11, 1981

[51] Int. Cl.³ .............................................. H05K 5/00
[52] U.S. Cl. ........................................ 174/59; 174/48; 174/52 R
[58] Field of Search .................. 174/59, 60, 52 R, 50, 174/81, 48; 339/132 R, 132 B, 132 T

[56] References Cited

U.S. PATENT DOCUMENTS

| | | | |
|---|---|---|---|
| 2,334,550 | 11/1943 | Griffith | 339/132 B X |
| 3,147,337 | 9/1964 | Chennell | 174/60 X |
| 3,610,810 | 10/1971 | Fribley, Jr. | 174/59 |
| 3,617,811 | 11/1971 | McVoy | 174/59 X |
| 3,676,744 | 7/1972 | Pennypacker | 174/59 X |
| 3,951,490 | 4/1976 | Devendorf | 174/59 X |
| 3,996,415 | 12/1976 | Provorse | 174/48 |

*Primary Examiner*—A. T. Grimley
*Assistant Examiner*—D. A. Tone
*Attorney, Agent, or Firm*—B. B. Olive

[57] ABSTRACT

Cable splitters of the type used to split television (TV) and frequency modulated (FM) signals are modified to incorporate local electrical grounding means and are standardized in size and made adaptable for mounting in a standard weather protective housing so as to eliminate the need for separate local grounding blocks and the usual haphazard mounting of ground blocks, multiple cable splitters and jumper wires found in conventional non-standardized cable installations thereby providing a standardized signal splitter-ground module and housing therefor.

3 Claims, 6 Drawing Figures

COOPERATIVE TV-FM CABLE SPLITTER-GROUND MODULE AND HOUSING THEREFOR

Description

TECHNICAL FIELD

The invention relates to signal splitters and grounding devices of the type used in cable television installations and to housings for protecting such devices from the weather, tampering, and the like.

BACKGROUND ART

Cable installations associated with the cable television industry are presently being made in a non-uniform and non-standardized manner substantially unlike telephone installations which have become standardized as to fittings and manner of installation. Further, the cable television industry has grown up with the practice of using a substantial number of components and substantial number of local installations of components which could be reduced to a standardized single installation and employment of a single set of components at one location. Further, with the present practices of installing multiple devices, e.g., ground blocks, multiple signal splitter devices, multiple jumper cables, and the like, the typical television cable installation on the typical private home or apartment will display numerous drip loops, service loops and ground wire loops associated with the various locally installed devices.

The typical incoming coaxial cable associated with cable television may also carry FM signals as well as TV signals. The installer is typically faced with the problem of increasing the number of outgoing signals because of a household or apartment installation needing additional connections to additional TV or FM receivers. Considerable time, additional cable, additional components and additional opportunities for equipment damage are inherently associated with existing cable television installation practices.

The foregoing deficiencies and opportunities for improvement are recognized by the present invention. The object of the present invention thus becomes that of overcoming the mentioned undesirable characteristics and other undesirable characteristics of present cable television installation practices and components and providing other advantages of economy, improved service, ability to enlarge existing cable television installations, and the like.

DISCLOSURE OF INVENTION

The present invention is aimed at providing a coaxial TV-FM signal cable splitter-ground module support and housing apparatus intended to encourage and establish a standard type of signal splitting and local electrical grounding installation practice irrespective of the number and type of signal receivers, i.e., TV or FM, single output port or multiple output port. The end result is that of providing a modified form of the conventional signal splitter so that any signal splitter made according to the invention and irrespective of the number of output ports can be installed in a standard type of splitter-ground module housing made according to the invention and with standardized loops of service cable enclosed along with the cable splitter and protected from weather, tampering, insects, rodents, and the like.

BEST MODE FOR CARRYING OUT THE INVENTION

Figure 1:
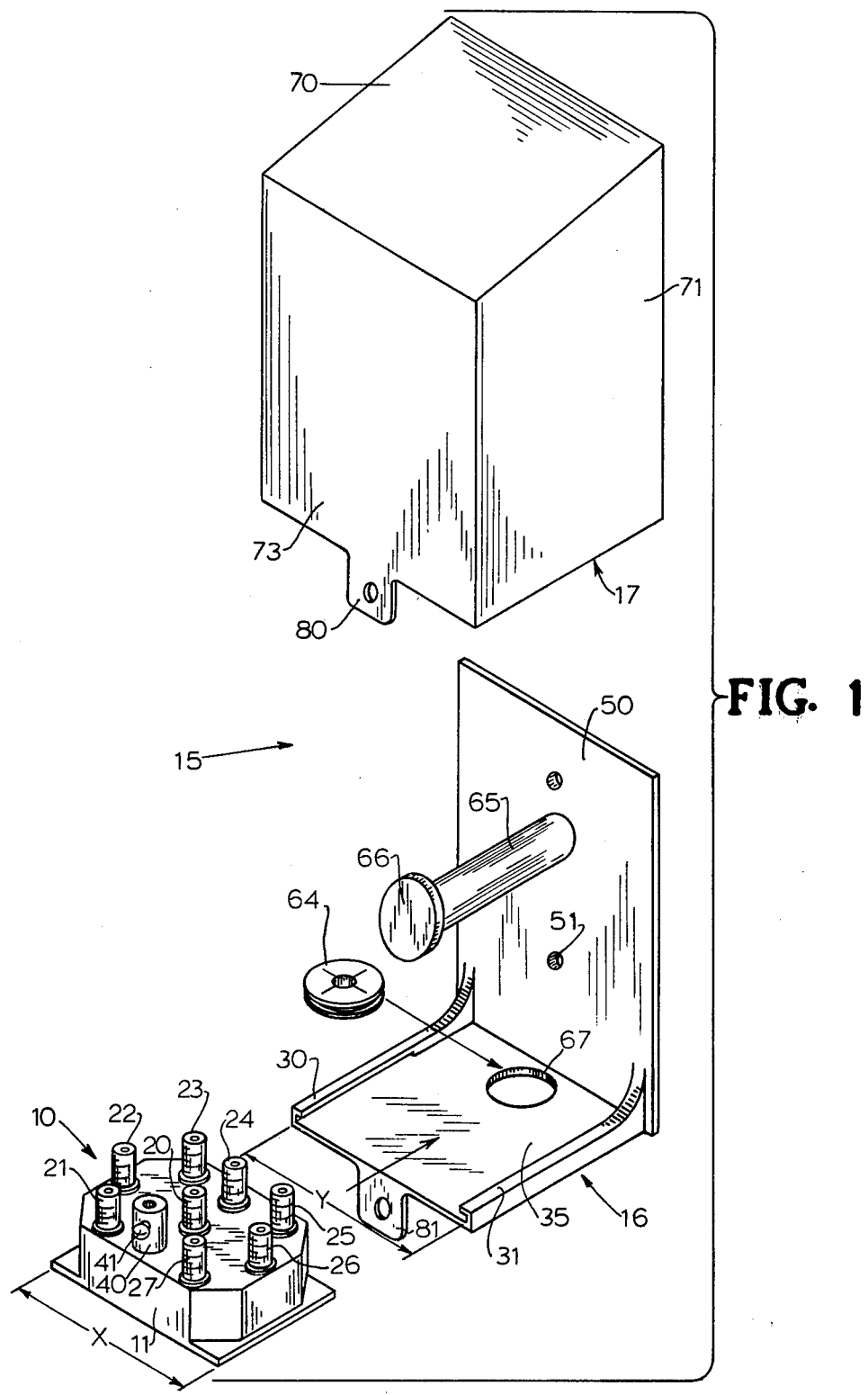
FIG. 1 is an exploded view of the components comprising the standardized splitter-ground module and housing arrangement of the invention but with cabling and ground wire eliminated for purposes of illustration.
Figure 2:
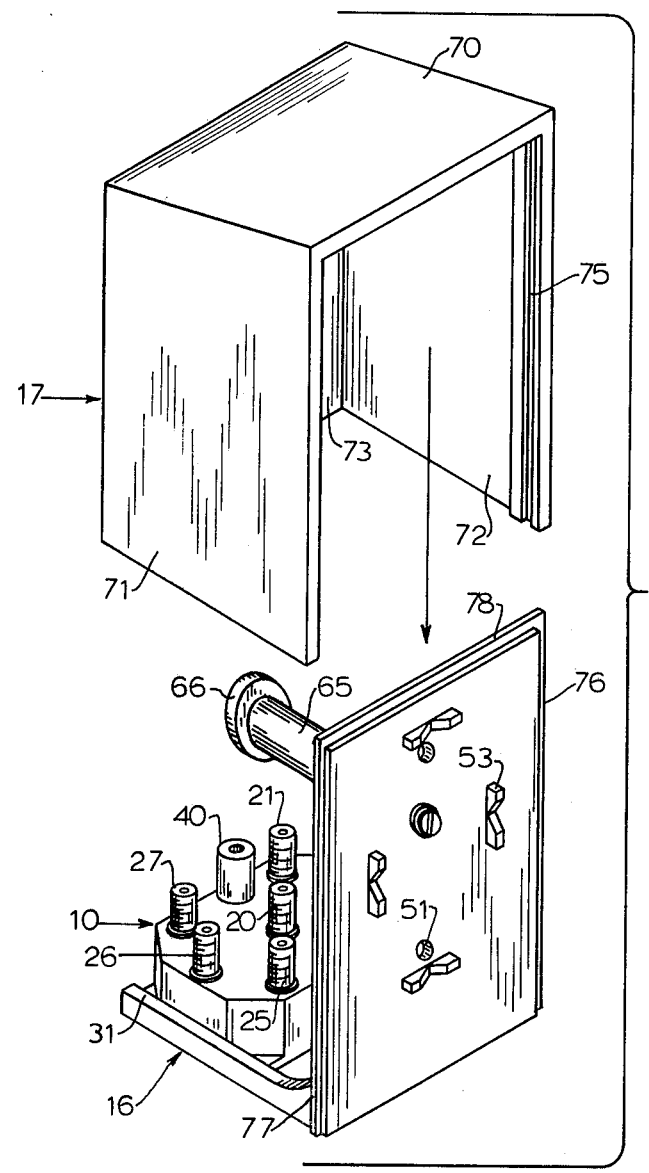
FIG. 2 is a perspective view of the FIG. 1 apparatus and showing the invention cable splitter-ground module in a typical installed position.
Figure 4:
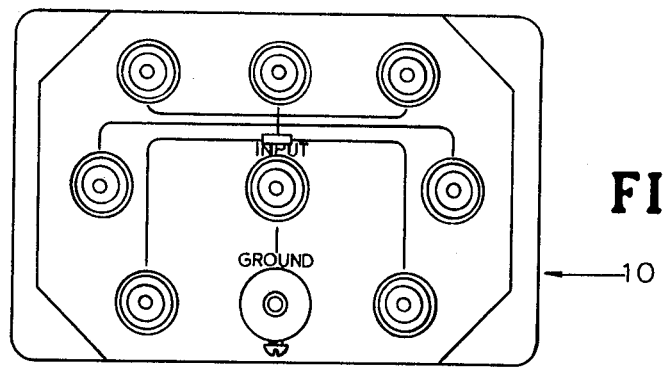
FIG. 4 is a plan view of the modified signal splitter of the invention and with the ground connection indicia added by the invention.

The invention apparatus comprises a signal splitter-ground module 10 and a structure 15 made up of a splitter-ground module support 16 and a housing 17.

Signal splitter-ground module 10 represents a modification of a type signal splitter commonly employed in the cable television industry and also combines means for electrical grounding which conventionally requires a separate grounding block. Splitter-ground module 10 may, for example, be in the form of what is described in the trade as a 2-way 4-way, 6-way, 8-way, et cetera, dependent on the number of so-called output ports, i.e., output TV-FM signal connections. The type splitter-ground module illustrated by way of example represents a 7-way signal splitter, i.e., a signal splitter having one input port 20 for attachment to an incoming coaxial cable carrying selected TV-FM signals and seven output ports 21-27 for distributing the TV-FM signals to various rooms of a house, apartments, et cetera. Splitter-ground module 10, as illustrated, is based on a modification of a widely used design of signal splitter sold by RMS Electronics, Inc., Bronx, N.Y. 10462, under the trademark RMS. This type of signal splitter as with signal splitters obtained from other manufacturing sources may be obtained with a varying number of output ports. Also, as will become apparent, signal splitters from other manufacturing sources can be readily modified, according to the invention requirements and so as to provide a combined signal splitter-ground module as in the illustrated embodiment.

Figure 5:
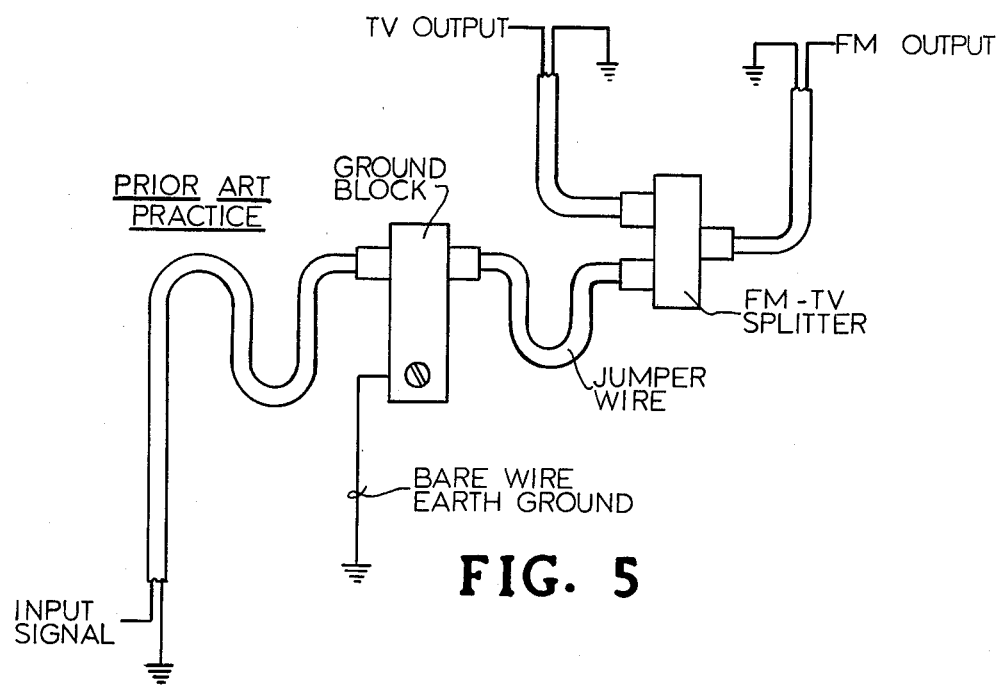
FIG. 5 is a schematic illustration of a typical installation according to prior art practices.

The invention requires a modification of the conventional signal splitter as illustrated in two respects. First, a selected dimension X is made standard for all splitters used with the invention so as to be able to mate this dimension of the signal splitter enclosure with the dimension Y of the guides 30, 31 on base wall member 35. Typically, dimension X is not critical in the manufacture of conventional signal splitters and may in fact vary substantially as to signal splitters made by the same manufacturer but with different numbers of output ports. This lack of standardization can be appreciated from the illustration in FIG. 5 showing how the cable connection components are typically secured in a nonuniform, non-standardized manner on the side of a building structure in which dimensions of the cable connecting and grounding components are not critical. As previously pointed out, a principal aim of the invention is to provide a type of signal splitter-ground module and a structure for receiving and enclosing the signal splitter-ground module so as to bring about a standardization of cable connecting practices within the industry and gain the many advantages previously discussed as in FIGS. 3 and 6.

Figure 6:
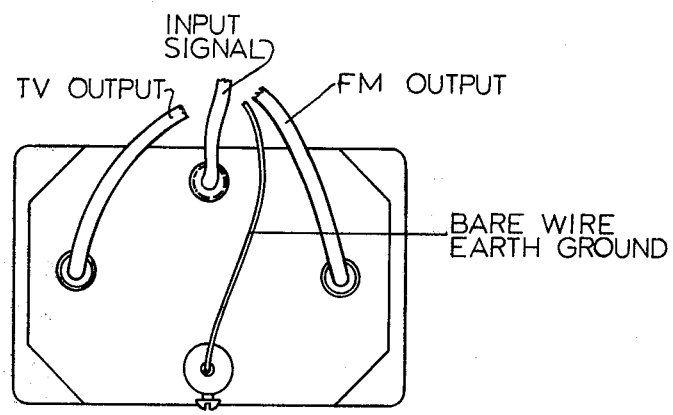
FIG. 6 is a plan view similar to FIG. 4 but with the indicia eliminated for purposes of illustration and selected cables connected for purposes of illustration.

Another modification to the conventional splitter comprises addition of the grounding port 40 adapted to receive and secure with screw 41 the bare end of a grounding wire 45 seen in FIG. 6. While other electrical grounding arrangements might be employed, the embodiment illustrated very quickly trains the cable technician or installer to expect access to a ground port on the signal splitter in the same sense in which the technician or installer has previously been trained to work with input and output ports. Thus, the need for a separate ground block as illustrated in FIG. 5 is eliminated. The conventional signal splitter incorporates a metal enclosure and in the present invention the signal splitter-ground module 10 incorporates the metal enclosure 11 to which one side of each of the output ports 21–27 is grounded. Thus, grounding of all the output ports is achieved through ground wire 45 which is electrically connected to the metal enclosure 11 through the grounding port 40 as previously discussed. While not illustrated, it will also be understood that the conventional circuitry and signal splitting components required for the selected TV-FM signal splitting are enclosed in the metal enclosure 11 and follow conventional practices so far as construction and operation are concerned.

Figure 3:
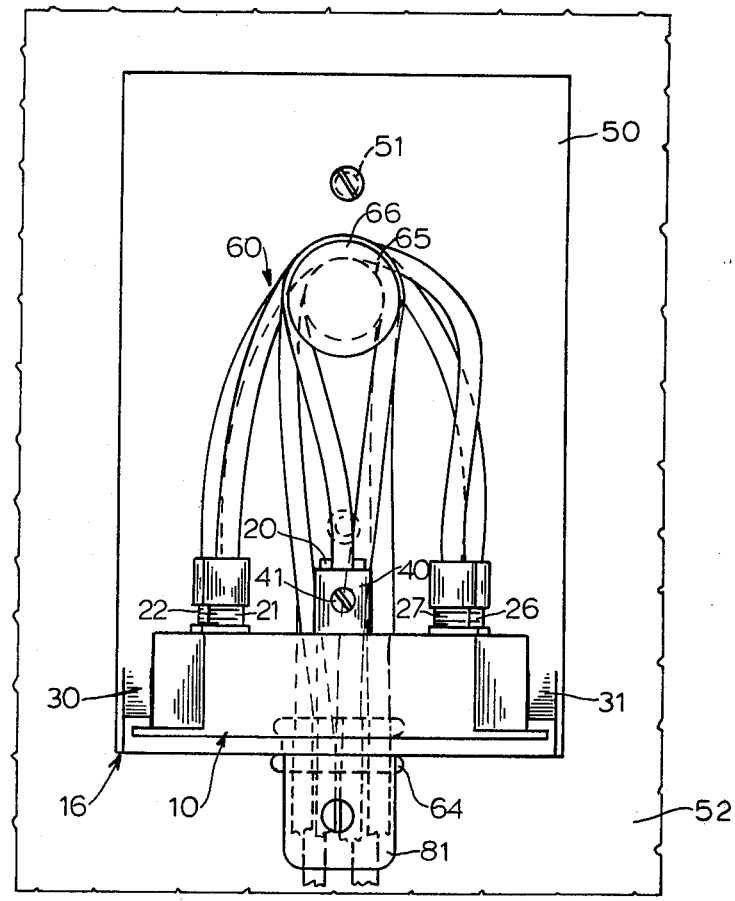
FIG. 3 is a front view of a signal splitter-ground module made according to the invention and illustrated without the cover of the invention housing but with typical cabling connections and with service loops supported with the invention apparatus.

The horizontally-positioned rectangular base wall member 35 provides a means for slidably receiving and securing splitter-ground module 10. A vertical rectangular back wall member 50 extends upwardly from base wall member 35 in perpendicular relation thereto. Back wall member 50 is provided with apertures 51 for receiving screws, nails, or other suitable means for securing the wall member 50 to a building structure 52, or the like, however suits the particular installation. An air space between the vertical wall member 50 and the selected structure 52, whatever it might be, is assured by means of the projections 53. Necessary service loops 60, as illustrated in FIG. 3, are supported by a horizontal post member 65 extending outwardly and forwardly of back wall member 50 and having an outer knob portion 66 to assist in retaining the service loops 60. Protection against entry of insects, rodents, and the like, is provided by a suitably shaped, flexible, slitted grommet 64 inserted in the cable passage 67.

The integrally formed, removable housing 17 comprises a top wall 70, sidewalls 71, 72, and front wall 73. Appropriately shaped guides 75 on housing 17 mate correspondingly shaped side edges 76, 77 and top edge 78 so as to establish a tight fitting relation between housing 17 and back wall member 50. Security and protection against vandalism is provided by mating locking tabs 80, 81.

The construction of signal splitter-ground module 10 will generally follow conventional practices with regard to selection of materials for forming the enclosure 11 and the various input and output ports. Structure 15, of course, lends itself to a wide variety of forms of manufacture and choice of materials. Plastic molding or metal forming techniques as employed with conventional telephone protector housings are readily adapted to the type of housing construction suited to the invention.

What can be seen from the foregoing description is that by standardizing the form of the signal splitter-ground module irrespective of the number of ports, e.g., a 7-way output port splitter as in FIG. 1 versus a 2-way output splitter as in FIG. 6, the technician or installer becomes accustomed to a standardized type of signal splitter, a standardized type of installation, and a standardized type of electrical grounding arrangement. Further, as with a telephone installation, the technician or installer will very quickly learn to look for a standard type of cable box when repairs are necessary or modifications to the cable system are to be made in the same sense that the telephone repairman is materially assisted by the standardization which has taken place in the telephone industry. Further, effective weatherproofing and protection of the signal splitter is assured by the invention configuration.

While illustrated in reference to one type of commercially available signal splitter modified according to the invention, it is recognized that the invention could be adapted to signal splitters from various manufacturers with differing dimensions. Thus, it is recognized that the securing guides 30, 31 could be made adjustable or shims or adapters could be employed to allow various width signal splitter-ground modules to be used with a fixed set of guides all within the scope of the invention.

We claim:

1. A coaxial cable TV-FM signal splitter-ground module, module support and associated housing adapted for establishing a standard type of signal splitting and local electrical grounding installation for varying numbers of signal receivers to be serviced from a common incoming signal cable, comprising:

(a) a signal splitter-ground module having an input cable port, a selected number and at least one output port, splitting means adapted to split an incoming signal received at said input cable port and derive therefrom a selected number and at least one of other signals selectively conducted to said number of output ports, a metal enclosure enclosing said splitting means and mounting said ports with one side of each said port being electrically grounded through said enclosure and at least one dimension of said enclosure being of a predetermined selected standard length, a grounding connector comprising means electrically connected to said enclosure and adapted to releasably receive one end of a ground wire having another portion connected to electrical ground for grounding said enclosure and the side of each said port electrically grounded therethrough; and (b) a support-housing structure adapted for being detachably secured to a building and for releasably receiving and providing weather protective covering for said splitter-ground module and the signal coupling connections associated therewith, said support-housing structure comprising:

(i) a horizontal rectangular base wall member defined by front, back and side edges, having securing means sized to accommodate said splitter-ground module enclosure dimension and adapted for slidably receiving and supporting a portion of said splitter-ground module enclosure incorporating said dimension and for supporting said splitter-ground module within the confines of said base wall member, having an aperture formed in said base wall member in a central, rearwardly located portion thereof and adapted for passage of incoming and outgoing cables to be coupled to said ports;

(ii) a vertical rectangular back wall member secured to the said back edge of said base wall member and extending upwardly therefrom in perpendicular relation thereto, said back wall member being adapted to be secured to a building structure for supporting said base wall member with said module thereon;

(iii) a horizontal post member secured to and extending outwardly from said back wall member and overlying and vertically spaced above said splitter-ground module, said post member being adapted to receive and support selected service loop portions of incoming and outgoing cables above said splitter-ground module; and (iv) a housing formed for slidable fit on said back wall member and having top, side and front wall portions adapted when said housing is installed on said back wall member to provide in cooperation with said base and back wall members a weather-protected enclosure surrounding said splitter-ground module, said post member and those service loop portions of cabling supported on said post member.

2. A splitter-ground module, module support and housing therefor as claimed in claim 1 wherein said splitter-ground module enclosure includes outwardly extending base flanges thereon and said base wall member securing means is adapted to receive a pair of oppositely disposed said base flanges in slidable relation thereto.

3. A splitter-ground module, module support and housing therefor as claimed in claim 2 wherein said back wall member includes means for establishing an air space between said back wall member and a said building structure when secured thereto.

* * * * *